United States Patent [19]

Latos

[11] 4,334,262
[45] Jun. 8, 1982

[54] FLASH LAMP ARRAY HAVING COMPOSITE CIRCUIT BOARD AND ELECTRIC SHIELD MEMBER

[75] Inventor: Edward L. Latos, Mentor, Ohio

[73] Assignee: General Electric Company, Schenectady, N.Y.

[21] Appl. No.: 183,626

[22] Filed: Sep. 2, 1980

[51] Int. Cl.³ .............................................. G03B 15/02
[52] U.S. Cl. ........................................ 362/11; 362/13; 362/15
[58] Field of Search ...................... 362/8, 3, 11, 13, 15; 361/404, 405, 406, 408, 399; 156/901; 339/17 D, 143

[56] References Cited

U.S. PATENT DOCUMENTS

| | | | |
|---|---|---|---|
| 2,270,166 | 1/1942 | Hiensch et al. ................... | 339/17 E |
| 3,315,071 | 4/1967 | Pfefferle ............................... | 362/11 |
| 3,464,051 | 8/1969 | Webb ................................. | 361/406 |
| 3,608,451 | 9/1971 | Kelem .................................. | 362/13 |
| 3,778,681 | 12/1973 | Wilson ............................... | 361/405 |
| 4,104,705 | 8/1978 | Levand, Jr. et al. ................ | 362/11 |

Primary Examiner—Donald P. Walsh
Attorney, Agent, or Firm—John F. McDevitt; Philip L. Schlamp

[57] ABSTRACT

A multiple photoflash unit of the planar array type having a composite circuit board and electric shield member to which a plurality of flash lamps are electrically connected for sequential flashing with reduced possibility of accidental flashing due to electrostatic voltage charges. In a preferred embodiment the associated members are sandwiched between front and back housing covers in a manner permitting the flash lamps to generate a mechanical spring action for additional physical support in the assembly.

8 Claims, 3 Drawing Figures

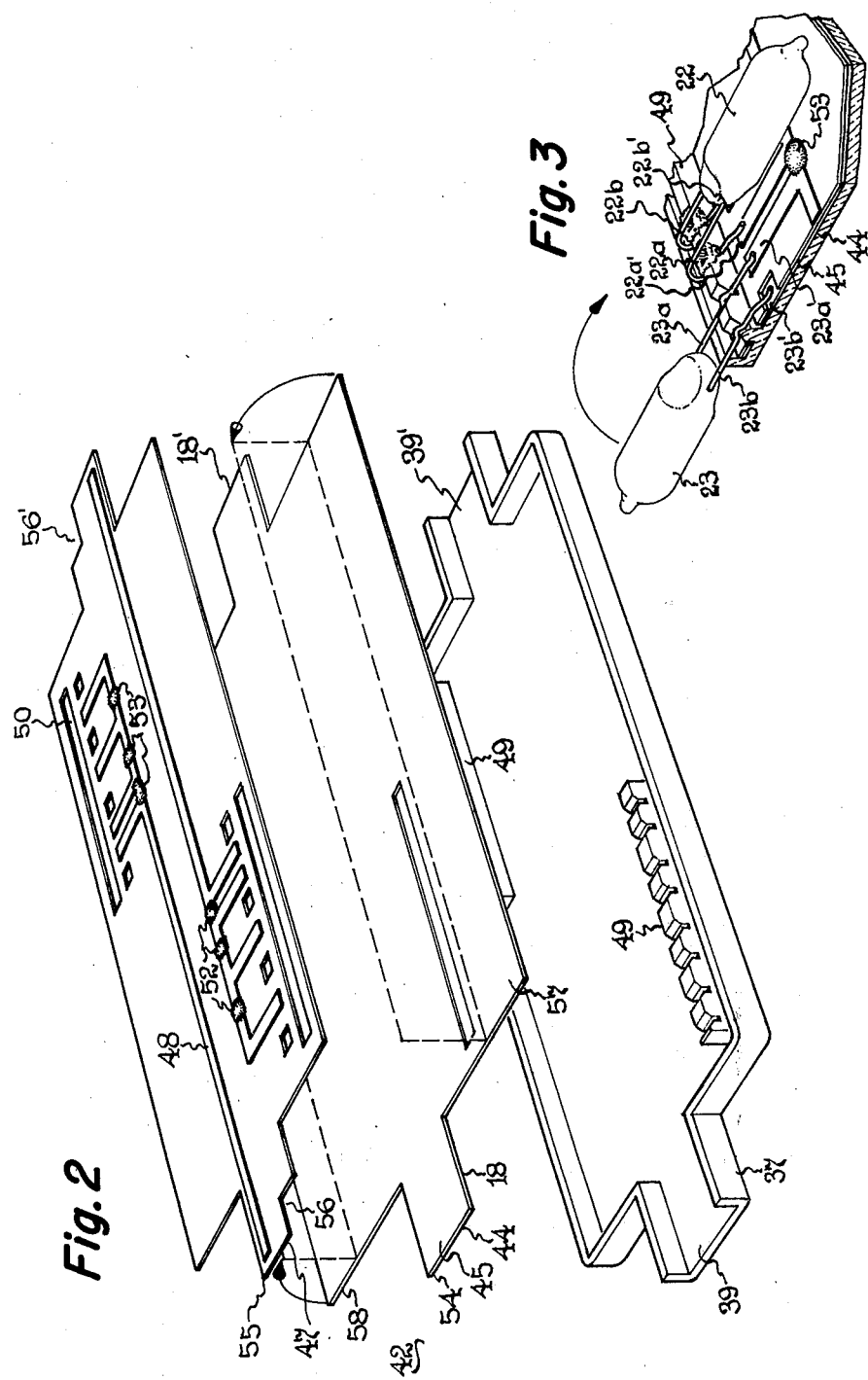

FLASH LAMP ARRAY HAVING COMPOSITE CIRCUIT BOARD AND ELECTRIC SHIELD MEMBER

BACKGROUND OF THE INVENTION

This invention is in the field of multiple photoflash lamp units such as the FlipFlash type of flash array.

U.S. Pat. No. 4,019,043 to Blount discloses a FlipFlash type of array having a metal foil shield positioned behind the circuit board and connected to the electrical ground of the circuit. The metal foil is in the form of a metal coating on a paper indicia sheet which is also provided with flash indicator means to indicate which of the lamps have been flashed. In U.S. Pat. No. 4,133,023 to Hanson, there is also disclosed a FlipFlash type of array having said shield member wherein the electrically insulated flash indicator material extends entirely up the sides of said conducting surface in order to prevent the lamp lead-in wires from becoming shorted against the shield. The still more recently issued U.S. Pat. No. 4,167,773 to Hanson also discloses such type shield member for a FlipFlash type of array wherein said electrically insulated flash indicator material positioned on the front conductive surface extends only partially up the sides of said conductive surface.

The conventional flash lamp arrays thereby utilize separate circuit board and electrical shield members which add both to cost and complexity of producing reliable multiple photoflash units. On the other hand, it is necessary to provide electrical insulation between the electrical circuitry employed to sequentially fire the plurality of flash lamps and a conductive electrical shield serving to reduce the possibility of accidental flashing of said flash lamps by electrostatic voltage charges or a person or object touching the flash lamp array. The present circuit board members provide the needed electrical insulation by having the electrical circuitry deposited on a dielectric substrate which is commonly a synthetic organic polymer material such as polystyrene. Electrical connection of the individual flash lamps in the present FlipFlash array is achieved by connecting both lead-in wires protruding from the individual flash lamps to switching circuitry located on the circuit board and which further includes separate electrical connection to the electrical shield member for grounding of said switching circuitry. It would be desirable, therefore, to achieve sequential firing of the individual flash lamps in a more simple manner and which can be carried out with a minimum modification of the existing multiple photoflash lamp units.

CROSS REFERENCE TO RELATED APPLICATION

A pending application Ser. No. 183,625, filed concurrently herewith, entitled "Flash Lamp Array Having Combined Shield and Connector" in the name of Vincent H. Weber, and assigned to the present assignee, describes a different multiple photoflash array wherein the individual flash lamps are electrically connected to the shield member.

SUMMARY OF THE INVENTION

Briefly, the present invention comprises a composite circuit board and electrical shield member for a multiple flash lamp array in the form of a conductive sheet having an electrically insulative surface layer with electrical circuitry deposited thereon to sequentially fire a plurality of associated flash lamps and whereby a pair of lead-in wires extending from the individual flash lamps is electrically connected in said switching circuitry by having one lead-in wire connected to the electrical circuitry with the remaining lead-in wire being electrically connected to the underlying conductive sheet. In one preferred embodiment, the multiple flash lamp array comprises a vertically elongated composite circuit board and electrical shield member in the form of a conductive sheet having an electrically insulative surface layer with electrical circuitry deposited thereon to sequentially fire a plurality of elongated flash lamps of the electrically fired type operatively associated therewith, said plurality of elongated flash lamps being positioned over the front side of said composite circuit board and electrical shield member and lying horizontally and stacked vertically, a plastic reflector unit being positioned behind said flash lamps in front of said composite circuit board electrical shield member, and with each of said flash lamps having a pair of lead-in wires extending therefrom with one of each pair of lead-in wires being electrically connected to the electrical circuitry and with the remaining lead-in wires being electrically connected to the underlying conductive sheet. In said preferred embodiment, the flash lamp array further includes front and back cover members with the individual flash lamps being physically supported by mechanical spring action being exerted between said front and back cover members. The mechanical spring action is obtained by means of mounting said flash lamps on a protuberance extending upwardly from the back cover member which extends through an opening provided in said composite circuit board and electrical shield member. Since the general structural configuration and switching operation of the present photoflash unit is in other respects the same as previously described in the above referenced U.S. patents, it should only be further necessary in providing the following detailed description of the present improvement to describe the structural and operational modifications made thereto.

BRIEF DESCRIPTION OF THE DRAWINGS

FIG. 2 illustrates a different preferred embodiment for the composite circuit board and electrical shield member of the present invention, and FIG. 3 is a partial cross sectional view of the composite member depicted in FIG. 1 that illustrates the electrical connection for the flash lamps thereto.

DESCRIPTION OF THE PREFERRED EMBODIMENTS

Figure 1:
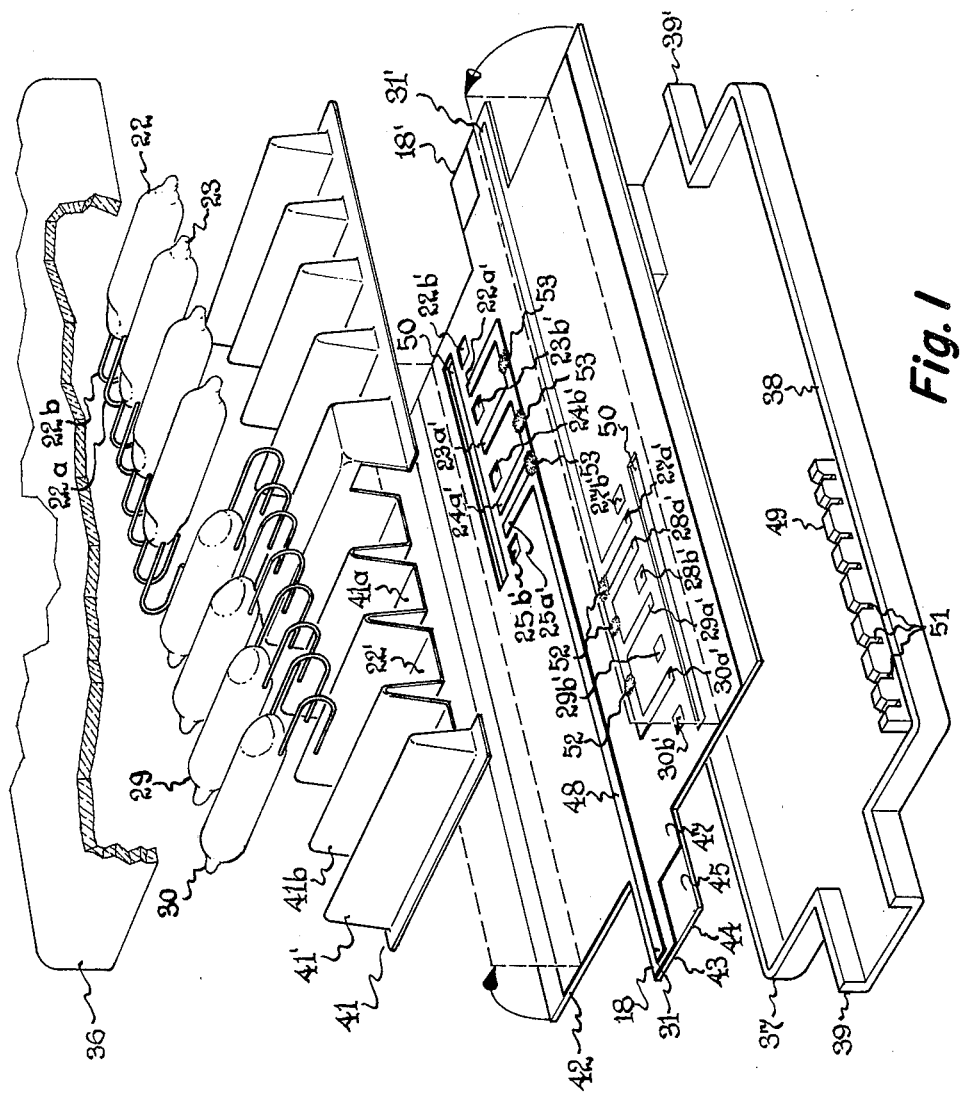
FIG. 1 is a perspective view of a multiple flash lamp array in accordance with a preferred embodiment of the invention.

In FIG. 1, the general construction of the flash lamp array comprises front and back housing members 36 and 37, which preferably are made of plastic. Said front and back housing members are joined together at their sides in the assembled array as indicated at the seam line 38 and the back housing member 37 includes integral extensions 39 and 39' at the ends thereof which partly surround and protect the connector tabs 18 and 18' which function to facilitate mechanical attachment of a photoflash unit to the camera socket. Sandwiched between the front and back of the housing members 36 and 37, in the order named, are the flash lamps 22, etc., a unitary reflector and barrier member 41 (preferably of white plastic) shaped to provide the individual reflectors 22', etc. and barriers 41' between adjacent lamps to prevent synthetic flashing of the lamps when an adjacent lamp is flashed. A composite circuit board and electrical shield member 42 having the modified construction in accordance with the present invention includes integral connector tabs 18 and 18', and may be further provided with instructions, information, and other indicia such as flash indicators (not shown), located behind the respective lamps and which change color due to heat and/or light radiation from flashing lamps, thus indicating at a glance which of the lamps have been flashed or not flashed.

The modified composite circuit board and electrical shield member 42 of the present invention includes a conductive base layer or sheet 43 and which can be thin cardboard 44 coated with a conductive metal 45 such as aluminum on the upper major surface, an electrically insulative surface layer 47, such as plastic, covering said metal foil layer 45, and electrical switching circuitry 48 being deposited on said plastic layer 47. The deposited switching circuitry 48 can be formed by various known techniques with conductive inks, metal films and the like. Metal foil layer 45 functions as an electrical shield to reduce the possibility of flash lamps being accidentally flashed by an electrostatic voltage when the array is handled as well as to ground the residual voltage charge in the firing pulses being applied to said flash lamps. The rear housing member 37 can be transparent (either of clear material or provided with window openings) to permit viewing of the indicia means conventionally applied on the sheet member 43 and further operatively associated with openings permitting radiation exposure from the flash lamps (not shown). The front housing member 36 is transparent at least in front of the lamps 22, etc. to permit light from flashing lamps to emerge frontally of the array and may be tinted to alter the color of light from flash lamps and also may be provided with lenses or prisms for controlling the light distribution pattern.

The height and width of the rectangular flash lamp array are substantially greater than its thickness and the heights and widths of the reflector member 41 as well as the composite circuit board and electrical shield member 42 are substantially the same as the interior height and width of the housing member 36 to facilitate holding these parts in place after final assembly. The reflector and barrier member 41 is a one-piece member, preferably of molded white plastic interspersed with titanium dioxide, shaped to provide the reflectors 22' etc., in the form of planar rear portions 41a, etc. behind the respective lamps, and the tapered reflector sides 41b etc. between the adjacent lamps which also form the barriers 41' for preventing sympathetic flashing by which a lamp adjacent to a flashing lamp could be caused to flash due to heat and/or light radiation from the flashing lamp. The flash lamps 22 etc. are also physically supported in a novel manner permitting development of a mechanical spring force action in the final assembly. More particularly, the flash lamps are mounted in protuberances 49 extending upwardly from the rear housing member 37 and which further extend through openings 50 provided for registry therewith in the composite member 42. As can be noted, flash lamps 22 etc. in the present construction are formed so that the lead-in wires 22a and 22b etc. extending therefrom are bent when mounted in said protuberances to wedge against the interior surface of the front housing member 36 in the final assembled position.

The switching circuitry 48 which is in the form of a printed circuit deposited on the upper major surface of said composite member 42 causes sequential flashing of the flash lamps when firing voltage pulses are applied to the terminals 31 and 31'. The top and bottom halves of said printed circuitry preferably are reverse mirror images of each other and which are actuated when the applicable connected tab 18 or 18' is inserted in the camera socket. In the preferred embodiment shown, a pair of printed circuit pads 22a' and 22b' are provided on the circuit pattern to which the lead-in wires 22a and 22b of lamp 22 are to be connected. Circuit pad 22b' is in the form of an opening extending to the underlying foil layer 45 for completion of the electric circuit to said flash lamp. Similarly, circuit pads 23a' and 23b' through 25a' and 25b', and 27a' and 27b' through 30a' and 30b' are provided for connection to the lead-in wires of the remaining lamps. The numbers and the letters in the circuit pad designations correspond to those of the lead-in wires. Electrical connection of the respective lead-in wires to the connector pads is carried out in a conventional manner after the flash lamps have been mechanically secured by said lead-in wires to the slots 51 provided in the protuberances 49 as above generally indicated. Thus, said lead-in wires are first mechanically secured in the slotted openings which is followed by making electrical contact of the lead-in wires 22a etc. to the respective connector pads 22a' etc. while the lead-in wires 22b etc. are inserted through openings for electrical contact with the underlying circuit pads 22b' etc. provided in the metal foil layer 45. Conventional radiation activated switches 52 and 53 are connected across and between the "a'" circuit pads which are electrically connected together to the connector terminals 31 and 31' where the high voltage firing pulses are applied. Said radiation activated switches are respectively located behind the flash lamps for actuation thereby and conversion from an open circuit condition of high resistance to a closed circuit condition of low resistance in order to produce the desired sequential firing of the associated flash lamps. Common electrical connection of the "b'" circuit pads in the electrical circuit is provided by the underlying metal foil layer 45 that serves to electrically ground the circuit without further means.

In FIG. 2 there is shown a modified construction for the present composite circuit board and electrical shield member wherein the individual circuit board and electrical shield components are separately formed and thereafter adhesively bonded together or otherwise joined in a conventional manner to produce an assembly operating as above described. Accordingly, only the essential components in said modified embodiment need be further described and the same numeral identification is employed to identify common structural elements in the construction. The composite board member 42 is shown having a general configuration for sandwiching between front and back cover members of the photoflash lamp unit of which only back cover member 37 has been shown in the drawing. Said back cover member 37 again includes the integral extensions 39 and 39' at the ends thereof to accommodate connector tab elements 18 and 18' of the composite circuit board and electrical shield member 42. Similarly, a pair of protuberance elements 49 are depicted for registration with openings 50 provided in the composite member. The electrical shield component 54 of said composite member 42 is also of a sheet construction having a metal foil layer 45 overlying a dielectric substrate layer 44 which can be paper, cardboard, or plastic. The circuit board component 55 of said composite member 42 consists of circuit pattern 48 which has been deposited on another dielectric layer 47. Said circuit board component further includes a pair of notches 56 and 56' to expose portions of the underlying metal foil layer 45 when the said component has been joined to the electrical shield component 54. The notches permit electrical grounding of the switching circuit pattern 48 at each end of the composite member when the connector tabs 18 and 18' have been inserted into the camera socket. Bent side portions 57 and 58 of the composite member 42 flank the array of flash lamps 22 etc. in the final array aiding to electrically shield said lamps as well as the electrical circuitry.

In FIG. 3 there has been shown a partial cross section illustrating the manner in which the flash lamps are physically supported in the above described embodiments and to further include the electrical connection of said flash lamps to the sequential switching circuitry. Accordingly, a pair of said flash lamps 22 and 23 are illustrated with flash lamp 22 illustrating initial joinder to protuberance 49 while flash lamp 23 illustrates the final lamp position in the assembled array. In said final lamp position which is achieved by simply bending the lamp in-leads after the initial joinder, a mechanical spring action will be generated by the assembled flash lamp when sandwiched between the front and back housing members. If the material of construction for protuberances 49 is a thermoplastic, then conventional ultrasonic bonding can be employed to mechanically secure the lamp in-leads in the slotted opening as shown. Electrical contact of the lamp lead-in wires 22a, 22b, 23a, and 23b to the circuit pads 22a', 22b', 23a' and 23b', respectively, can simply be obtained by a further mechanical wedging action when the flash lamps have been positioned as shown in the final assembly. A radiation-sensitive switch 53 has also been shown to depict its relative position with respect to the finally positioned flash lamp 23.

While preferred embodiments of the invention have been shown and described, various other embodiments, modifications, thereof will become apparent to persons skilled in the art and thereby fall within the scope of the invention as defined in the following claims.

I claim:

1. A multiple flash lamp array utilizing a multilayer circuit board and electrical shield member in the form of a conductive sheet having an electrically insulative surface layer deposited directly thereon with electrical circuitry being deposited on said insulative surface layer to sequentially fire a plurality of high voltage flash lamps operatively associated therewith, and each of said flash lamps having a pair of lead-in wires extending therefrom with one of each pair of lead-in wires being electrically connected to the electrical circuitry and with the remaining lead-in wires being electrically connected to the underlying conductive sheet.

2. An array as in claim 1 which further includes front and back cover members.

3. An array as in claim 2 wherein the flash lamps are further physically supported by mechanical spring action between front and back cover members which are joined together.

4. An array as in claim 3 wherein the mechanical spring action is obtained by means of mounting said flash lamps on an electrically insulative protuberance extending upwardly from the back cover member which extends through an opening provided in said multilayer circuit board and electrical shield member.

5. A multiple flash lamp array comprising a vertically elongated multilayer circuit board and electrical shield member in the form of a conductive sheet having an electrically insulative surface layer deposited directly thereon with electrical circuitry being deposited on said insulative surface layer to sequentially fire a plurality of elongated high voltage flash lamps of the electrically fired type operatively associated therewith, said plurality of elongated flash lamps being positioned over the front side of said composite circuit board and electrical shield member and lying horizontally and stacked vertically, a plastic reflector unit being positioned behind said lamps and in front of said multilayer circuit board and electrical shield member, and each of said flash lamps having a pair of lead-in wires extending therefrom with one of each pair of lead-in wires being electrically connected to the electrical circuitry and with the remaining lead-in wires being electrically connected to the underlying conductive sheet.

6. An array as in claim 5 which further includes front the back cover members which are joined together.

7. An array as in claim 6 wherein the elongated flash lamps are further physically supported by mechanical spring action between said front and back cover members.

8. An array as in claim 7 wherein the mechanical spring action is obtained by means of mounting said elongated flash lamps on an electrically insulative protuberance extending upwardly from the back cover member which extends through an opening provided in said multilayer circuit board and electrical shield member.

* * * * *